United States Patent [19]

Tseng

[11] Patent Number: 5,696,395
[45] Date of Patent: Dec. 9, 1997

[54] DYNAMIC RANDOM ACCESS MEMORY WITH FIN-TYPE STACKED CAPACITOR

[75] Inventor: Horng-Huei Tseng, Hsinchu, Taiwan

[73] Assignee: Industrial Technology Research Institute, Hsin-Chu, Taiwan

[21] Appl. No.: 703,253

[22] Filed: Aug. 26, 1996

Related U.S. Application Data

[62] Division of Ser. No. 811,537, Dec. 20, 1991, Pat. No. 5,573,967.

[51] Int. Cl.[6] .................. H01L 27/108; H01L 29/76; H01L 29/94; H01L 21/70
[52] U.S. Cl. .................. 257/308; 257/296; 257/301; 257/303; 257/306; 257/308; 257/309; 437/52; 437/60; 437/919
[58] Field of Search ................... 257/296, 303, 257/306, 308, 309, 301; 437/52, 60, 919

[56] References Cited

U.S. PATENT DOCUMENTS

| 4,700,457 | 10/1987 | Matsukawa | 437/52 |
|---|---|---|---|
| 4,742,018 | 5/1988 | Kimura et al. | 437/48 |
| 5,126,810 | 6/1992 | Gotou | 257/306 |
| 5,134,085 | 7/1992 | Gilgen et al. | 257/308 |
| 5,156,993 | 10/1992 | Su | 437/52 |
| 5,262,662 | 11/1993 | Gonzalez et al. | 257/308 |
| 5,572,053 | 11/1996 | Ema | 257/308 |

FOREIGN PATENT DOCUMENTS

| 1-154552 | 6/1989 | Japan | 257/308 |

OTHER PUBLICATIONS

T. Ema, et al. "3–Dimensional Stacked Capacitor Cell For 16M and 64M DRAMs" IEDM 1988 pp. 592–595.

*Primary Examiner*—Valencia Martin Wallace
*Attorney, Agent, or Firm*—George O. Saile; Stephen B. Ackerman

[57] ABSTRACT

A method is described for fabricating a dynamic random access memory having a high capacitance fin-type stacked capacitor. The method begins by selectively forming relatively thick field oxide areas on the surface of a semiconductor substrate while leaving device areas for fabrication of field effect devices. A gate dielectric layer is formed on the substrate in the device areas. A relatively thick first layer of polysilicon is deposited on the field oxide areas and the device areas. Portions of the first polysilicon layer is removed while leaving portions thereof for the gate structure in the device areas, and portions over the field oxide areas. Source/drain structures are formed within the device areas of said semiconductor substrate associated with the gate structures. A first insulator layer composed at least in part of silicon nitride is formed over the device and field oxide areas. The fin-type stacked capacitors are now formed by first depositing a second polysilicon layer over the device and field oxide areas. Alternating layers of polysilicon and insulator are deposited over the device and field oxide areas with a first polysilicon layer being contact to the device areas for electrical contact and the last polysilicon layer being the topmost of the alternating layers. The stack of alternating polysilicon and insulator layers are now patterned to form the basis of the stacked capacitors. The exposed edges of the insulator layers are controlably and laterally isotropic etched to increase the planned surface area of the capacitor by forming fin-type structures. A fourth polysilicon layer is deposited over the device and field oxide areas to complete the lower electrode of the stacked capacitor. A capacitor dielectric layer is formed over the lower electrode of the stacked capacitor and the top polysilicon electrode layer is deposited thereover to complete the stacked capacitors.

4 Claims, 3 Drawing Sheets

DYNAMIC RANDOM ACCESS MEMORY WITH FIN-TYPE STACKED CAPACITOR

This application is a division of Ser. No. 07/811,537, filed Dec. 20, 1991, U.S. Pat. No. 5,573,967.

RELATED PATENT APPLICATIONS (1) U.S. Pat. No. 5,126,916 issued Jun. 30, 1992 by the same inventor H. H. Tseng entitled "STACKED CAPACITOR DRAM CELL AND METHOD OF FABRICATING".

(2) U.S. Pat. No. 3,192,702 issued Mar. 9, 1993 by the same inventor H. H. Tseng entitled "SELF-ALIGNED CYLINDRICAL STACKED CAPACITOR DRAM CELL".

(3) U.S. Pat. No. 5,573,967 issued Nov. 12, 1996 by the same inventor H. H. Tseng entitled "METHOD FOR MAKING DYNAMIC RANDOM ACCESS MEMORY WITH FIN-TYPE STACKED CAPACITOR".

BACKGROUND OF THE INVENTION

1. Field of the Invention

The present invention relates to methods of fabricating a dynamic random access memory having a high capacitance stacked capacitor, and more particularly fin-type stacked capacitors.

2. Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, a decrease in storage capacitance, which results from the reduction in cell size, leads to draw backs, such as a lowering source/drain ratio and undesirable signal problems in terms of reliability. In order to achieve the desired higher level of integration, it requires the technology to keep almost the same storage capacitance on a greatly reduced cell area.

Efforts to maintain or increase the storage capacitance in memory cells with greater packing densities in the fabrication of fin-type stacked capacitors are evident in S. Kimura et al U.S. Pat. No. 4,742,018 and T. Matsukawa U.S. Pat. No. 4,700,457. The publications "Are you ready for next-generation dynamic RAM chips?" by F. Masuoka pages 109–112, IEEE Spectrum, November 1990, and T. Ema et al "3-DIMENSIONAL STACKED CAPACITOR CELL FOR 16 M AND 64 M DRAMS" IEDM 1988 pages 592–595 describe the problems and possible fin-type capacitor structures for future generations of dynamic RAMs. Another approach to achieve sufficient capacitance in high density memories is the use of a stacked trench capacitor cell as described in copending U.S. patent application of Wen Doe Su entitled "FABRICATION OF MEMORY CELL WITH AN IMPROVED CAPACITOR" Ser. No. 07/568,945 filed Aug. 17, 1990.

It is well known that in the art of integrated circuit device manufacture, one of the primary goals is increasing the number of device that can be placed into a given unit space on the semiconductor chip. As the traditional fabrication process begin to approach the limit of reduction, considerable attention has been applied to forming device elements on over and above the wafer to take advantage of extra versatility of third dimension.

One of the successful vertically oriented integrated circuit devices is the fin-type stacked capacitor. Briefly, such a stacked capacitor is formed by forming the stacked capacitor structures laying over the gate electrode on active and field oxide regions and diffusion region. The processing of such structures have become very complicated and require lithography and etching steps which are not in step with the very small dimensions required in the present and future state of the art. Although there has been much work done in accomplishing these small size devices and increased capacitance therein, there is still great need for devices with even greater capacitance for a given space in order to achieve even greater packing densities, and improve the DRAM products of the future.

SUMMARY OF THE INVENTION

Accordingly, it is a primary object of the invention to provide a process for producing a memory cell and resulting structure with a fin-type stacked capacitor having greater capacitance per unit area and by a very manufacturable process.

A method is described for fabricating a dynamic random access memory having a high capacitance fin-type stacked capacitor. The method begins by selectively forming relatively thick field oxide areas on the surface of a semiconductor substrate while leaving device areas for fabrication of field effect devices. A gate dielectric layer is formed on the substrate in the device areas. A relatively thick first layer of polysilicon is deposited on the field oxide areas and the device areas. Portions of the first polysilicon layer is removed while leaving portions thereof for the gate structure in the device areas, and portions over the field oxide areas. Source/drain structures are formed within the device areas of said semiconductor substrate associated with the gate structures. A first insulator layer composed at least in part of silicon nitride is formed over the device and field oxide areas. The fin-type stacked capacitors are now formed by first depositing a second polysilicon layer over the device and field oxide areas. Alternating layers of polysilicon and insulator are deposited over the device and field oxide areas with a first polysilicon layer being contact to the device areas for electrical contact and the last polysilicon layer being the topmost of the alternating layers. The stack of alternating polysilicon and insulator layers are now patterned to form the basis of the stacked capacitors. The exposed edges of the insulator layers are controlably and laterally isotropic etched to increase the planned surface area of the capacitor by forming fin-type structures. A fourth polysilicon layer is deposited over the device and field oxide areas to complete the lower electrode of the stacked capacitor. A capacitor dielectric layer is formed over the lower electrode of the stacked capacitor and the top polysilicon electrode layer is deposited thereover to complete the stacked capacitors.

A dynamic random access memory is described which have a high capacitance fin-type stacked capacitor. Relatively thick field oxide areas on the surface of a semiconductor substrate surround device areas having field effect devices. A gate dielectric and electrode structure are on the substrate in the device areas. An interconnecting line composed of polysilicon layer over the field oxide areas. Source/drain structures within the device areas of the semiconductor substrate associated with the gate structures. A first insulator layer composed at least in part of silicon nitride is located over the device and field oxide areas and patterned to leave source/drain structures open in the said device areas where electrical contact is desired to the stacked capacitors. The stacked capacitor structure is constructed of a patterned structure of alternating layers of polysilicon and insulator over the device and field oxide areas with a first polysilicon layer being in electrical contact to the source/drain areas and the last polysilicon layer being the topmost of alternating layers. The alternating insulator layers are shorter in diameter than the polysilicon layers to increase the planned surface area of the capacitor while maintaining a strong dielectric core of the stacked capacitor. A lower electrode completing polysilicon layer is located over the surfaces of the alternating layers to complete the lower electrode of the stacked capacitor. A capacitor dielectric layer is over the lower electrode of the stacked capacitor. A top polysilicon electrode layer is located thereover to complete the fin-type stacked capacitor.

BRIEF DESCRIPTIONS OF THE DRAWINGS

FIGS. 1 through 4 is a schematic cross-sectional representation of a first embodiment method for fabricating a fin-type stacked capacitor in combination with a field effect device which is usable in a DRAM cell.

DESCRIPTION OF THE PREFERRED EMBODIMENTS

Figure 1:
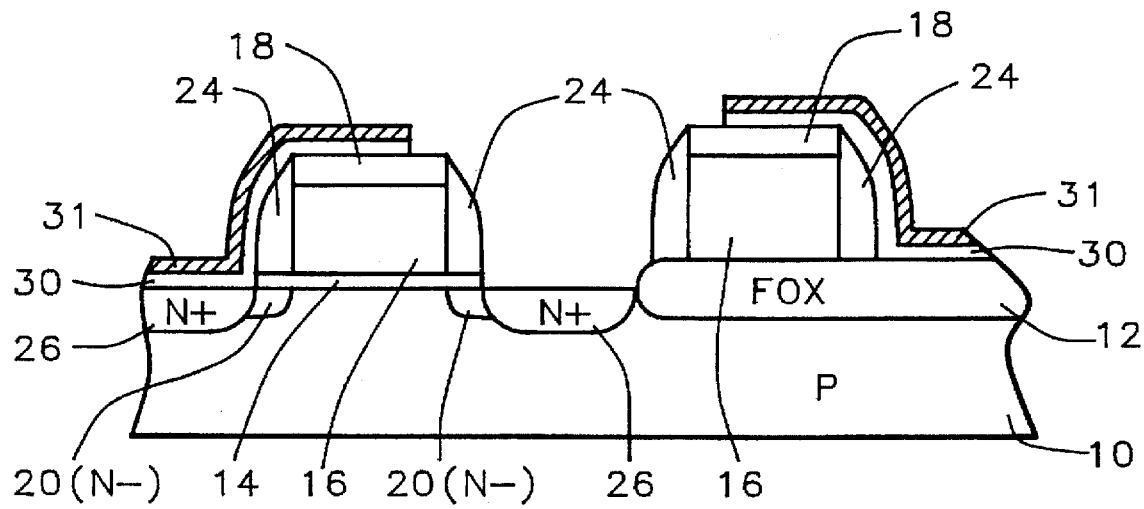

Referring now more particularly to FIGS. 1 through 4 there is shown an embodiment of the method for fabricating a self-aligned, fin-type stacked capacitor and field effect device structure. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 80 to 200 Angstroms. The polysilicon layer 16 is blanket deposited by LPCVD (Low Pressure Chemical Vapor Deposition) method. The preferred thickness of the first polysilicon layer 16 is between about 2000 to 4000 Angstroms. The polysilicon layer 16 is ion implanted with phosphorous or arsenic ions under the conditions 5 to 10 E 15 dosage per area and 20 to 60 Kev. or doped with phosphorus oxychloride at a temperature about 900° C. A surface silicon oxide or glass layer 18 is formed on the polysilicon layer 16. The layers 14, 16 and 18 are patterned by conventional lithography and anisotropic etching techniques as are conventional in the art to provide a desired pattern of gate electrodes and interconnection runners on the FOX 12 surfaces or elsewhere as seen in FIG. 1.

The source/drain structure of the MOS FET may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

FIG. 1, for example shows the ion implantations of N-dopants. Lithographic masks may be required to protect the areas not to be subjected to that particular N- ion implantation. The formation of the lithographic masks are done by conventional lithography and etching techniques. The N-lightly doped drain implantation 20 is done with, for example phosphorous P31 at a dose of between about 1 to 10 E 13 atoms/cm.$^2$ and with an energy of between about 20 to 40 Kev.

The dielectric spacer 24 is now to be formed followed by the completion of the lightly doped drain source/drain structures. A low temperature silicon oxide deposition is preferred such as through the chemical vapor deposition of tetraethoxysitane (TEOS) at a temperature in the range of between about 650° to 900° C. Other silicon oxide deposition methods include silane based LPCVD. The thickness of the dielectric silicon dioxide layer 24 is between about 2000 to 5000 Angstroms and preferably about 2500 Angstroms.

An anisotropic etching of this layer produces the dielectric spacer layer 24 on the sidewalls of the layer structures 14, 16, 18. The preferred anisotropic etching uses a conventional reactive ion etching ambient.

A thin silicon oxide, silicon nitride or the like masking layer (not shown) is usually formed upon the layer structure regions 14, 16, 18, the spacers 24 and the exposed monocrystalline silicon substrate regions to protect the surfaces from ion implantation damage. The conditions for forming this layer are LPCVD deposition of TEOS or LPCVD silicon nitride deposition at about 600° to 900° C. The preferred thickness of this oxide layer is between about 200 to 1000 Angstroms and a preferred thickness of about 600 Angstroms.

The N+ source/drain ion implantation uses Arsenic, As75 with a dose of between about 2 E 15 to 1 E 16 atoms/cm.$^2$ and energy of between about 20 to 70 Kev. to complete the source/drain regions 26 of the N channel lightly doped drain MOS FET integrated circuits device as seen in the FIG. 1.

A first insulator layer is formed over the field oxide and device areas. This layer is composed at least in part of silicon nitride for future etch stop needs. The layer is typically composed of a layer 30 of silicon oxide and a layer 31 of silicon nitride and silicon oxide. These silicon oxide layers are formed by low pressure chemical vapor deposition (LPCVD) at a temperature of 720° C.; gases of Si(CH$_3$)$_4$, N$_2$O and oxygen; and pressure of 200 to 300 mTorr. The silicon nitride layer is formed by LPCVD at a temperature of 760° C.; gases of SiH$_2$Cl$_2$ and ammonia; and a pressure of 350 mTorr. The thickness of the silicon oxide layer 30 is between about 200 to 500 Angstroms and the total thickness of the layer 31 is between about 400 to 1000 Angstroms wherein the silicon nitride portion is between about 200 to 500 Angstroms and the silicon oxide portion is between about 200 to 500 Angstroms. The layer 30, 31 is patterned using conventional lithography and etching techniques to open the source/drain structures in the device areas desired to be electrically and self-aligned contacted as seen in FIG. 1.

Figure 2:
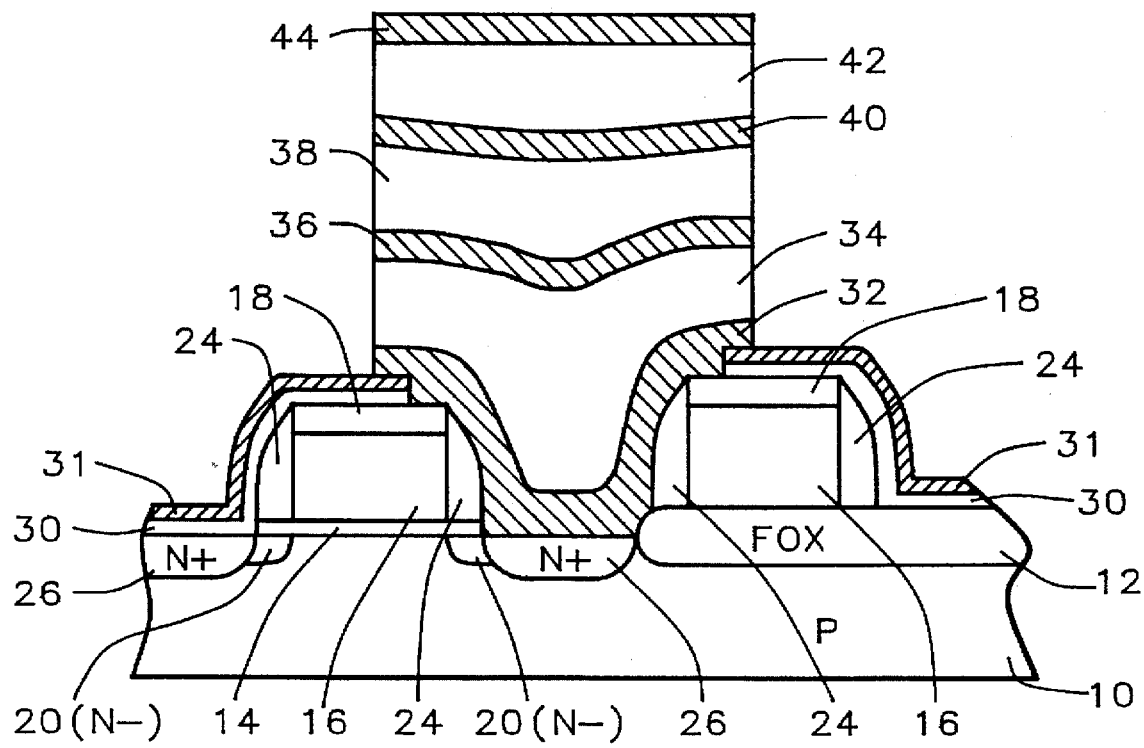

Referring now to FIG. 2, alternating layers polysilicon and insulator are deposited over the device and field oxide areas. A first layer 32 of polysilicon is in electrical contact to the required source/drain device areas. This is followed by insulator layer 34, polysilicon layer 36, insulator layer 38, polysilicon layer 40, insulator layer and topmost polysilicon layer 44. The thickness of polysilicon layers are between about 500 to 1500 Angstroms. The first polysilicon layer 32 is a self-aligned contact to the source/drain 26 in the device areas. The thickness of the insulator layers are between about 1000 to 2000 Angstroms. The insulator layers are preferably composed of silicon oxide. The polysilicon layers are preferably in-situ phosphorus doped deposited by using a temperature of 570° C.; with mixed reaction gases of (15% $PH_3$ and 85% silane) and (5% $PH_3$ and 95% nitrogen). The silicon oxide layers are formed by LPCVD with temperature of 720° C.; reaction gas of $Si(CH_3)_4$, $N_2O$ and Oxygen; and a pressure of 200 to 300 mTorr.

The alternating layered structure in now patterned using conventional lithography and our preferred process for each polysilicon layer uses, for example a magnetic enhanced reactive ion etcher (MERIE) PR5000E made by Applied Materials Co. with the following process conditions of power at 50 to 150 watts; pressure at 50 mTorr.; magnetic field at 30 guass; gas flows ate HBr 25 to 45 sccm., Chlorine 25 to 45 sccm., and Helium/Oxygen 6 to 10 sccm.; which give an etch rate of about 1000 Angstroms per minute. The selectivity of polysilicon to silicon oxide is greater than 12. The preferred anisotropic etching for silicon oxide layers uses the MERIE tool with the conditions power at 550 watts; magnetic field at 80 guass; pressure at 150 mTorr.; gas flow at $CF_4$ sccm., $CHF_3$ 40 sccm., and argon 40 sccm.; which give an etch rate of about 6000 Angstroms per minute. The selectivity of silicon oxide to polysilicon is greater than 15. The patterned structure is shown in FIG. 2.

Figure 3:
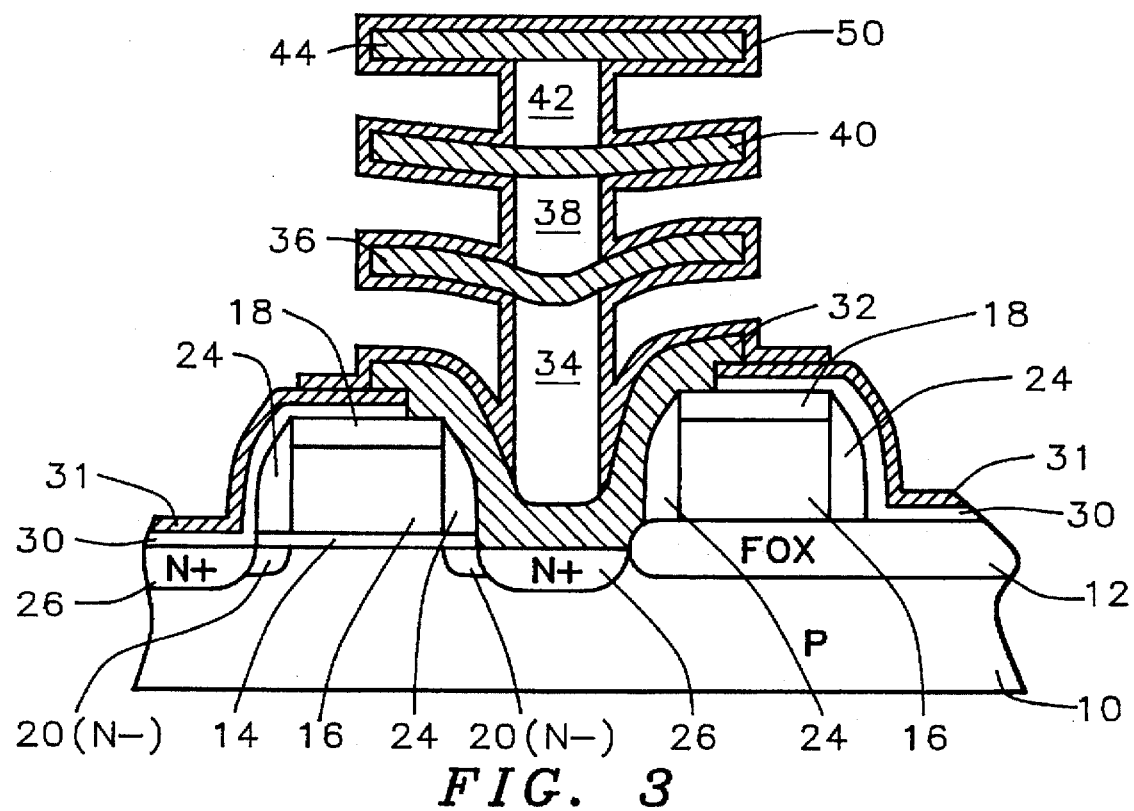

The next steps are critical ones and can be better understood with reference to FIG. 3. The alternating insulator layers now must be isotropically etched in a controlable manner so as to leave a insulator, such as silicon oxide, core with fins of alternating layers of polysilicon. The process can use either wet water diluted hydofluoric acid (HF) or hydrofluoric acid vapor. The wet diluted HF solution isotropic process uses either 50:1 or 20:1 diluted solution which give etch rates of about 100 Angstroms per minute and 200 to 300 Angstroms per minute, respectively. This allows a controlable etch of removal of 2000 to 4000 Angstroms of silicon oxide layer. The alternate of HF vapor is much slower than the isotropic process, but has the advantages of being a cleaner process without need for cleaning after etching. This process will be used where thinner layers of silicon oxide are to be removed as will be seen in the most advanced process designs of the future.

The lateral thickness of insulator layer 34, insulator layer 38, and insulator layer 42, removed is between about 2000 to 4000 Angstroms which leaves a core insulator layer 34, insulator layer 38, and insulator layer 42, between about 5000 to 10000 Angstroms in length. Polysilicon fin, 32, polysilicon fin, 36, polysilicon fin 40, and polysilicon fin 44, are between about 500 to 1500 Angstroms in thickness, and between about 7000 to 14000 Angstroms in length, with the center of each polysilicon fin residing on a core insulator layer.

An in situ doped polysilicon layer 50 is deposited thereover to complete the lower electrode of the stacked capacitor. This layer 50 is deposited by the in-situ phosphorus doped LPCVD process given above and to a thickness of between about 200 to 600 Angstroms. This structure is shown in FIG. 3. The capacitor structure is protected by a lithographic mask (not shown) and the unmasked portions of polysilicon layer 50 is removed by reactive ion etching with, for example the PR5000EMERIE tool using pressure at 60 to 100 mTorr.; power at 100 to 150 watts; gauss flow at HBr 25 to 45 sccm., Chlorine 25 to 45 sccm., and Helium/Oxygen 6 to to 45 sccm., Chlorine 25 to 45 sccm., and Helium/Oxygen 6 to 10 sccm.; to give an etch rate of greater than about 3000 Angstroms per minute.

Figure 4:
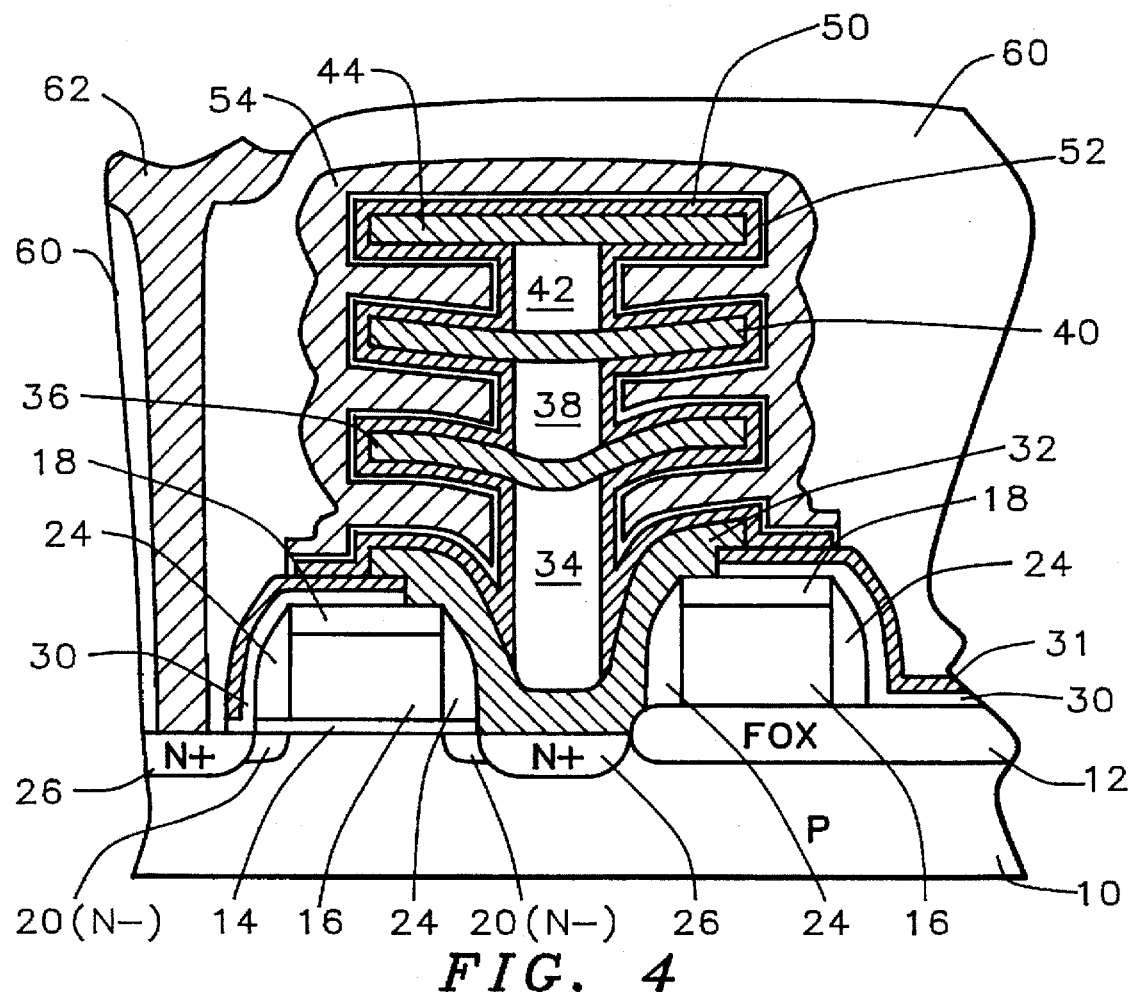

The capacitor dielectric layer 52 is now formed over the fin-type polysilicon layer 50 as seen in FIG. 4. The layer is typically either composed of layers of silicon nitride and silicon oxide (NO) or layers of silicon oxide, silicon nitride and silicon oxide (ONO). In making the ONO dielectric, the first or bottom silicon oxide, O layer is formed by, for example exposure to deionized water (DI) to form a native silicon oxide having a thickness of about 50 Angstroms. The silicon nitride, N layer is formed by LPCVD wherein the gases are ammonia and $SiH_2Cl_2$, temperature of 760° C., pressure of 350 mTorr., to give a resulting thickness of between about 50 to 70 Angstroms. The top silicon oxide, O layer may be formed by exposing the N layer to dry oxygen at about 850° C. for about 30 minutes to form a silicon nitride/oxide layer.

The top storage node electrode is formed by depositing third polysilicon layer 54 by in-situ deposition using silane. The thickness of this layer 54 is between about 500 to 2000 Angstroms. The layer 54 is now patterned using conventional lithography and etching techniques The final structure is shown with the next levels of electrical connections to the FET and fin-type stacked capacitor cell of the DRAM integrated circuit is shown in FIG. 4 wherein insulator layer 60 has been deposited over the field oxide and device areas and a electrical contact is made to the source/drain 26 using a metallurgy via 62. The layer 60 is a thick layer in the range of 3000 to 6000 Angstroms or more and can preferably be planarized by heat flow or by etching. The layer 60 can be for example a phosphosilicate, glass, a borophosphosilicate glass, a silicon oxide—spin-on-glass—silicon oxide sandwich, or the like. Lithography and etching techniques are used to form the desired openings to a bit line contact. The desired contact metallurgy 62 is deposited and patterned as is known in the art. Higher levels of metallurgy can in turn be formed over the metal level 62. For example, a higher level of metallurgy contact to top capacitor electrode (not shown) is necessary.

The layer 60 may be composed of any suitable insulator, but borophosphosilicate glass is preferred. One method of forming this glass is by LPCVD using $Si(CH_3)_4$, $PH_3$ and a gaseous source of Boron at a temperature of 600° to 700° C. to produce, for example a glass with about 3% Boron and 5% phosphorus.

The metallurgy 62 may be composed of for example tungsten silicide. The formation of this contact metal may be by the LPCVD process using a temperature of 350° to 400° C.; pressure of 100 to 300 mTorr.; and gases of silane and $WF_6$. Of course, other contact metallurgies known in the art can alternatively be used.

While the invention has been particularly shown and described with reference to the preferred embodiments thereof, it will be understood by those skilled in the art that various changes in form and details may be made without departing from the spirit and scope of the invention.

What is claimed is:

1. A stacked capacitor structure, dynamic random access memory, (DRAM), device, with a fin-type shaped, polysilicon lower electrode, on a semiconductor structure, comprising:

field oxide regions in a semiconductor substrate;

a device region in said semiconductor substrate, between said field oxide regions;

a gate dielectric layer, on said device region;

a first polysilicon gate structure, on said gate dielectric layer, with an overlying cap insulator layer, and a polysilicon interconnecting structure, with an overlying cap insulator layer, on a field oxide region;

insulator spacers on the sidewalls of said polysilicon gate structure, and on said polysilicon interconnecting structure;

source and drain regions in said device region of said semiconductor substrate, in an area of said device region not covered by said polysilicon gate structure;

a composite dielectric layer, patterned to leave said source and drain regions open, in said device region, where electrical contact is desired to said stacked capacitor structure;

said fin-type shaped, polysilicon lower electrode, of said stacked capacitor structure, contacting one of said source and drain regions, in said device region, and partially overlying said composite dielectric layer, on said polysilicon gate structure, and partially overlying said composite dielectric layer on said polysilicon interconnecting structure, with said fin-type shaped, polysilicon lower electrode, constructed of, a series of lateral, polysilicon fins, between about 7000 to 14000 Angstroms, in length, with the bottom polysilicon fin, contacting one of said source and drain regions, a series of insulator core layers, between about 5000 to 10000 Angstroms, in length, residing in the center, between underlying and overlying said lateral, polysilicon fins, a connecting polysilicon layer overlying and traversing exposed surfaces of said lateral, polysilicon fins, and exposed surfaces of said insulator core layers;

a capacitor dielectric layer on said fin-shaped, polysilicon lower electrode; and a upper polysilicon electrode structure.

2. The stacked capacitor structure of claim 1, wherein the thickness of each said polysilicon fin is between about 500 to 1500 Angstroms.

3. The stacked capacitor structure of claim 1, wherein the composition of each said insulator core layer is silicon oxide, the thickness of each said insulator core layer is between about 1000 to 2000 Angstroms.

4. The stacked capacitor structure of claim 1, wherein said capacitor dielectric layer is composed of silicon oxide, silicon nitride and silicon oxide.

* * * * *